United States Patent
Kim et al.

(10) Patent No.: US 10,998,533 B2
(45) Date of Patent: May 4, 2021

(54) METHOD FOR MANUFACTURING DISPLAY DEVICE

(71) Applicant: SAMSUNG DISPLAY CO., LTD., Yongin-si (KR)

(72) Inventors: Heunggyu Kim, Yongin-si (KR); Donghoon Kwak, Yongin-si (KR); Dukki Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 114 days.

(21) Appl. No.: 16/454,497

(22) Filed: Jun. 27, 2019

(65) Prior Publication Data

US 2020/0127241 A1  Apr. 23, 2020

(30) Foreign Application Priority Data

Oct. 18, 2018  (KR) .................. 10-2018-0124542

(51) Int. Cl.
- *H01L 51/56* (2006.01)
- *H01L 51/52* (2006.01)
- *H01L 51/00* (2006.01)
- *H01L 27/32* (2006.01)

(52) U.S. Cl.
CPC .......... *H01L 51/56* (2013.01); *H01L 27/3244* (2013.01); *H01L 51/0005* (2013.01); *H01L 51/5203* (2013.01)

(58) Field of Classification Search
None
See application file for complete search history.

(56) References Cited

U.S. PATENT DOCUMENTS

| | | | |
|---|---|---|---|
| 7,989,025 B2* | 8/2011 | Sakai | H01L 51/0007 427/256 |
| 8,329,712 B2 | 12/2012 | Schoenfeld et al. | |
| 9,023,239 B2 | 5/2015 | Kawanami et al. | |
| 9,209,398 B2* | 12/2015 | Chesterfield | F26B 5/04 |
| 9,375,138 B2 | 6/2016 | Schaeffer et al. | |
| 10,573,813 B2* | 2/2020 | Jia | H01L 51/56 |
| 2006/0046062 A1 | 3/2006 | Nishigaki et al. | |
| 2007/0072004 A1* | 3/2007 | Sakai | H01L 51/0007 428/690 |

(Continued)

FOREIGN PATENT DOCUMENTS

| | | |
|---|---|---|
| JP | 4148933 B2 | 9/2008 |
| JP | 4631609 B2 | 2/2011 |

OTHER PUBLICATIONS

R. D. Deegan, et al., "Capillary flow as the cause of ring stains from dried liquid drops", Nature, 1997, vol. 389, pp. 827-829.

(Continued)

*Primary Examiner* — Michelle Mandala
(74) *Attorney, Agent, or Firm* — Lewis Roca Rothgerber Christie LLP

(57) ABSTRACT

Provided is a method for manufacturing a display device. The method may comprise providing a substrate, providing a first organic solution which includes a mixed solvent containing a first solvent having a first boiling point and a second solvent having a second boiling point, conducting a first depressurized drying to form a second organic solution, and conducting a second depressurized drying to form a preliminary organic layer.

20 Claims, 16 Drawing Sheets

(56) References Cited

U.S. PATENT DOCUMENTS

2013/0139720 A1\* 6/2013 Kawanami ............. C09D 11/02
106/31.13

OTHER PUBLICATIONS

D. Soltman, et al., "Inkjet-Printed Line Morphologies and Temperature Control of the Coffee Ring Effect", American Chemical Society, 2008, 24, pp. 2224-2231.

\* cited by examiner

METHOD FOR MANUFACTURING DISPLAY DEVICE

CROSS-REFERENCE TO RELATED APPLICATION

Korean Patent Application No. 10-2018-0124542, filed on Oct. 18, 2018, in the Korean Intellectual Property Office, and entitled: "Method for Manufacturing Display Device," is incorporated by reference herein in its entirety.

BACKGROUND

1. Field

Electronic devices, such as a mobile communication terminal, a digital camera, a laptop computer, a monitor and a TV, include a display device for displaying images.

2. Description of the Related Art

Development of an organic electroluminescence display device as the display device has actively progressed.

SUMMARY

Embodiments are directed to a method for manufacturing a display device, including providing a substrate on which a plurality of pixel defining layers are disposed, providing a first organic solution between the pixel defining layers, the first organic solution including a mixed solvent containing a first solvent having a first boiling point and a second solvent having a second boiling point, and an organic solute dissolved in the mixed solvent, conducting a first depressurized drying to form a second organic solution by applying a pressure of 0.01-1 torr to the first organic solution, and conducting a second depressurized drying to form a preliminary organic layer by applying a pressure of 0.0001-0.001 torr to the second organic solution.

A difference between the first boiling point and the second boiling point may be 20-220° C.

The first boiling point may be in a range of 160–290° C. The second boiling point may be in a range of 290–380° C., exclusive of 290° C.

A first distance between the substrate and an upper surface of the second organic solution may be 0.8-1.2 times a second distance between the substrate and an upper surface of the pixel defining layers.

The first depressurized drying may be performed at 10-23° C.

A ratio of the first solvent in the second organic solution with respect to the entirety of the second organic solution may be smaller than a ratio of the first solvent in the first organic solution with respect to the entirety of the first organic solution.

A ratio of a weight of the second solvent in the preliminary organic layer with respect to a total weight of the preliminary organic layer may be smaller than a ratio of a weight of the second solvent in the second organic solution with respect to a total weight of the second organic solution.

The method may further include an intermediate depressurized drying between the first depressurized drying and the second depressurized drying. The intermediate depressurized drying may include applying a pressure of 0.001-0.01 torr to the second organic solution.

The method may further include a pressurized drying between the first depressurized drying and the second depressurized drying. The pressurized drying may include applying a pressure of 750-1000 torr to the second organic solution.

With respect to a total weight of the mixed solvent, an amount of the first solvent may be 55-70 wt %, and an amount of the second solvent is 30-45 wt %.

The first solvent may include two or more different solvents.

The first solvent may include at least one of isobutylbenzoate, cyclohexylbenzene, 3-phenoxytoluene, triethyleneglycol dimethylether or diphenylether. The second solvent may include at least one of diisopropylnaphthalene, ethylhexylsalicylate, diisobutylphthalate or benzylbenzoate.

The first solvent may include triethyleneglycol dimethylether and diphenylether. The second solvent may be benzylbenzoate.

A content of the organic solute with respect to a total weight of the first organic solution may be 2-5 wt %.

The method may further include baking the preliminary organic layer to form an organic layer by supplying heat to the preliminary organic layer.

Embodiments are also directed to a method for manufacturing a display device including a base substrate, a first electrode disposed on the base substrate, and a plurality of organic layers disposed on the first electrode, the method including providing a first organic solution onto the first electrode, the first organic solution including a mixed solvent containing a first solvent having a first boiling point and a second solvent having a second boiling point as higher as 20-220° C. than the first boiling point, and an organic solute dissolved in the mixed solvent, conducting a first depressurized drying to form a second organic solution by drying the first organic solution under a pressure of 0.01-1 torr, conducting a second depressurized drying to form a preliminary organic layer by drying the second organic solution under a pressure of 0.0001-0.001 torr, and baking the preliminary organic layer to form at least one organic layer of the organic layers by supplying heat to the preliminary organic layer.

The display device may further include a plurality of pixel defining layers disposed on the base substrate. A first distance between the base substrate and an upper surface of the second organic solution may be 0.8-1.2 times a second distance between the base substrate and an upper surface of the pixel defining layers.

The first boiling point may be 160-290° C., and the second boiling point may be 290-380° C., exclusive of 290° C.

With respect to a total weight of the mixed solvent, an amount of the first solvent may be 55-70 wt %, and an amount of the second solvent is 30-45 wt %.

The organic solute may include a hole injection material, and the at least one organic layer may be a hole injection layer disposed on the first electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
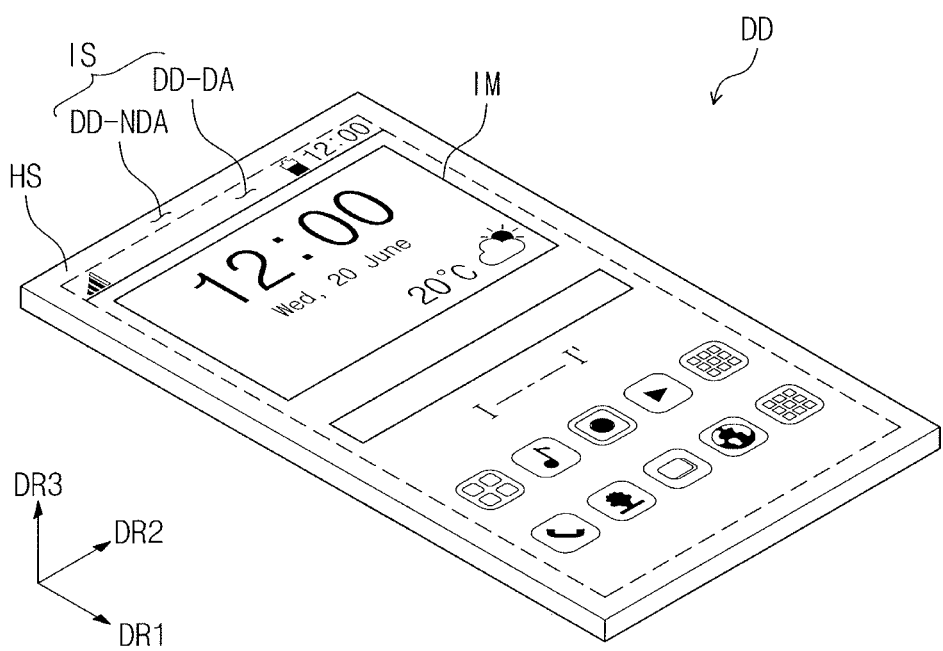
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The thickness and the ratio and the dimension of features may be exaggerated for effective description of the technical contents.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments will be described in detail with reference to the accompanying drawings.

FIG. 1 illustrates a perspective view of a display device DD according to an embodiment. As illustrated in FIG. 1, the display device DD may display an image IM through a display surface IS. The display surface IS may be parallel to a plane defined by a first direction axis DR1 and a second direction axis DR2. A third direction axis DR3 indicates a normal direction of the display surface IS, i.e., a thickness direction of the display device DD.

A front surface (or a top surface) and a back surface (or a bottom surface) of each member or unit described below are defined according to the third direction axis DR3. However, the first to third direction axes DR1, DR2 and DR3 illustrated in the embodiment are merely exemplary directions, and the directions indicated by the first to third direction axes DR1, DR2 and DR3 are relative concepts, so that the directions may change into other directions. Hereinafter, the first to third directions refer to the same reference numerals as the directions indicated by the first to third direction axes DR1, DR2, and DR3, respectively.

In an embodiment, the display device DD having a planar display surface is illustrated as an example. In some implementations, the display device DD may include a curved display surface or a stereoscopic display surface. The stereoscopic display surface may include a plurality of display areas indicating different directions from each other, and may also include, for example, a polygonal columnar display surface.

The display device DD according to the embodiment may be, for example, a rigid display device. In some implementations, the display device DD may be a flexible display device DD. In the embodiment, the display device DD applicable to a portable terminal is exemplarily illustrated. In some implementations, electronic modules, a camera module and a power module, etc. mounted on a main board may be accommodated in the housing HS to constitute the portable terminal. The display device DD may be applied to not only a large-sized electronic device such as a television, a monitor but also to a small- or medium-sized electronic device such as a tablet, a car navigation system, a game machine, a smart watch, etc.

As illustrated FIG. 1, the display surface IS may include a display area DD-DA in which the image IM is displayed and a non-display area DD-NDA adjacent to the display area DD-DA. The non-display area DD-NDA is an area in which the image is not displayed. As an example of the image IM, icon images are illustrated in FIG. 1.

The shape of the display area DD-DA and the shape of the non-display area DD-NDA may be relatively designed. For example, as illustrated in FIG. 1, the display area DD-DA may have a rectangular shape. The non-display area DD-NDA may surround the display area DD-DA.

Figure 2:
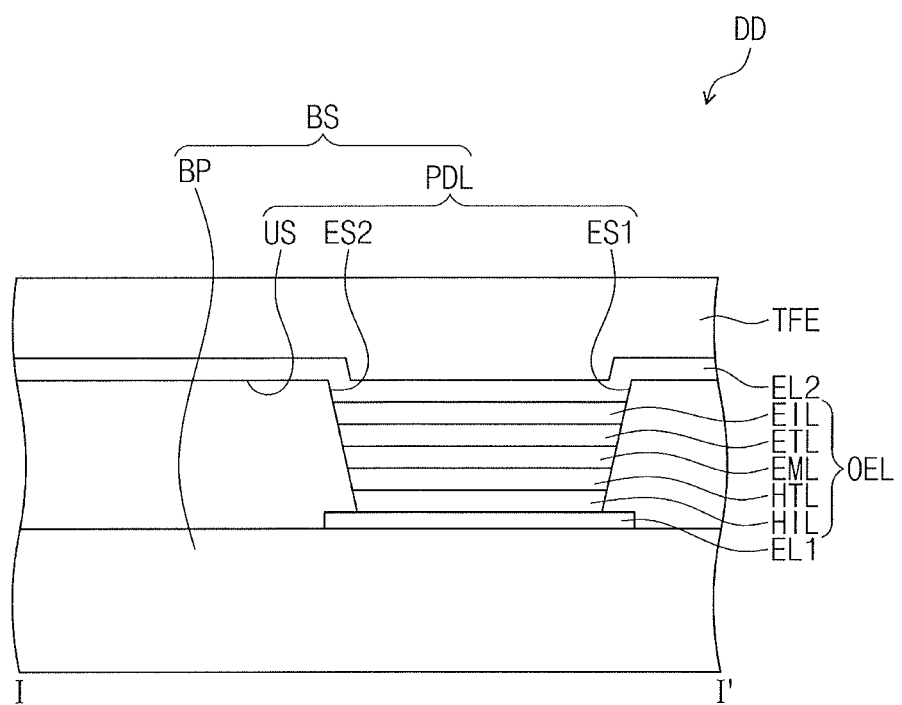
FIG. 2 illustrates a part of a cross section taken along line I-I' in FIG. 1.

FIG. 2 illustrates a part of a cross section taken along line I-I' in FIG. 1. FIG. 2 is a simple view illustrating the lamination relationship between the components constituting the display device DD.

The display device DD may include a substrate BS, a first electrode EL1 disposed on the substrate BS, a plurality of organic layers OEL disposed on the first electrode EL1, a second electrode EL2 disposed on the second electrode EL2, and a thin film encapsulation layer TFE disposed on the second electrode EL2.

The substrate BS may include a base substrate BP and a pixel defining layer PDL disposed on the base substrate BP.

In some implementations, the base substrate BP may further include a plurality of layers such as a support member, a circuit layer containing a plurality of transistors, and a functional layer. The plurality of layers may be bonded with an optical transparent bonding member.

A plurality of pixel defining layers PDL may be disposed on the base substrate BP. The pixel defining layers PDL may include a first surface ES1, a second surface ES2 facing the first surface ES1, and an upper surface US connecting the first surface ES1 and the second surface ES2.

The first electrode EL1 may be disposed on the substrate BS. The pixel defining layers PDL may be disposed between the first electrodes EL1 and at least a part thereof may overlap with the first electrodes EL1.

The first electrode EL1 has conductivity. The first electrode EL1 may be formed of a metal alloy or a conductive compound. The first electrode EL1 may be an anode. The first electrode EL1 may be a pixel electrode. The first electrode EL1 may be a transmissive electrode, a transflective electrode or a reflective electrode. When the first electrode EL1 is a transmissive electrode, the first electrode EL1 may include a transparent metal oxide such as indium tin oxide (ITO), indium zinc oxide (IZO), zinc oxide (ZnO), or indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or mixture thereof (for example, a mixture of Ag and Mg). In some implementations, the first electrode EL1 may have a multi-layered structure including a reflective film or a transflective film formed of the above material, and a transparent conductive film formed of ITO, IZO, ZnO or ITZO, etc.

The plurality of organic layers OEL may be disposed on the first electrode ELL The plurality of organic layers OEL may include a hole injection layer HIL, a hole transport layer HTL disposed on the hole injection layer HIL, a light emitting layer EML disposed on the hole transport layer HTL, an electron transport layer ETL disposed on the electron transport layer ETL, and an electron injection layer EIL disposed on the electron transport layer ETL. The hole injection layer HIL, the hole transport layer HTL, the light emitting layer EML, the electron transport layer ETL, and the electron injection layer HIL may be herein referred to as an organic layer OL (FIG. 8B).

The plurality of organic layers OEL may further include a hole buffer layer, an electron blocking layer, and a hole blocking layer.

The material of the plurality of organic layers OEL may be suitable organic materials known in the art.

For example, the hole injection layer HIL may include a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4', 4"-tris(3-methylphenylphenylamino)triphenylamine), TDATA (4,4'4"-tris(N,N-diphenylamino)triphenylamine), 2-TNATA (4,4',4"-tris{N,-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/camphor sulfonic acid), PANI/PSS((polyaniline)/poly(4-styrenesulfonate)), NPB(N,N'-di(naphthalene-1-yl)-N,N'-diphenyl-benzidine), polyesterketone containing triphenylamine (TPAPEK), 4-isopropyl-4'-methyldiphenyliodonium tetrakis(pentafluorophenyl)borate, and HAT-CN (dipyrazino[2,3-f: 2',3'-h]quinoxaline-2,3,6,7,10,11-hexacarbonitrile), etc.

The hole transport layer HTL may include, for example, a carbazole-based derivative such as N-phenylcarbazole or polyvinylcarbazole; a fluorine-based derivative; a triphenylamine derivative such as TPD (N,N'-bis(3-methylphenyl)-N,N-diphenyl[1,1-biphenyl]-4,4'-diamine), TCTA (4,4', 4"-tris(N-carbazolyl)triphenylamine)N; NPB(N,N-di (naphthalene-1-yl)-N,N-diphenyl-benzidine), TAPC (4,4'-cyclohexylidene bis[N,N-bis(4-methylphenyl) benzenamine]), HMTPD (4,4'-bis[N,N'-(3-tolyl)amino]-3, 3'-dimethylbiphenyl), and mCP (1,3-bis(N-carbazolyl) benzene), etc.

The second electrode EL2 may be disposed on the electron injection layer EIL. The second electrode EL2 may be a common electrode or a cathode. The second electrode EL2 may be a transmissive electrode, a transflective electrode, or a reflective electrode. In some implementations, substantially the same contents as those described in the first electrode EL1 may be applied. The second electrode EL2 may be connected to an auxiliary electrode. When the second electrode EL2 is connected to the auxiliary electrode, the resistance of the second electrode EL2 may be reduced.

The thin film encapsulation layer TFE may be disposed on the second electrode EL2. The thin film encapsulation layer TFE according to an embodiment may directly cover the second electrode EL2. In some implementations, a capping layer covering the second electrode EL2 may be further disposed, and the thin film encapsulation layer TFE may directly cover the capping layer. The thin film encapsulation layer TFE may include an organic material-containing layer and an inorganic material-containing layer.

At least one among the plurality of organic layers OEL described above may be formed by an inkjet printing method. For example, one or more of the described organic layers may be manufactured by a method S10 for manufacturing a display device DD according to an embodiment.

Figure 3A:
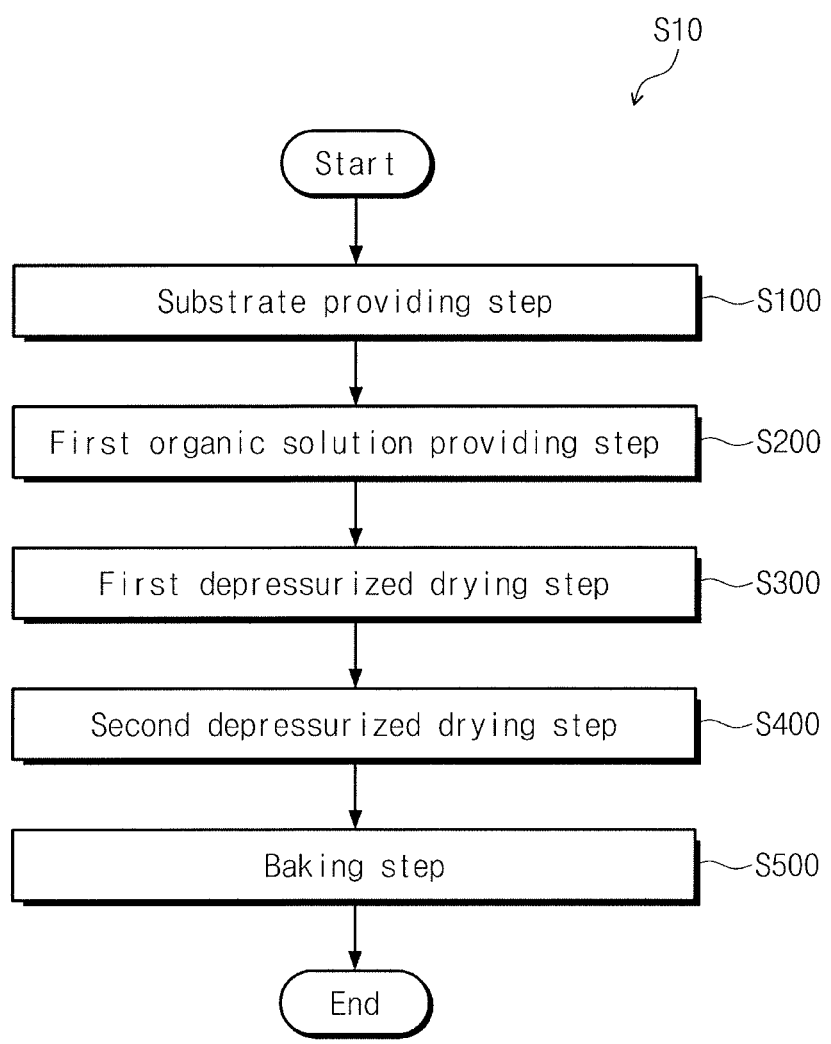
FIG. 3A illustrates a flowchart of a method for manufacturing a display device according to an embodiment.
Figure 3B:
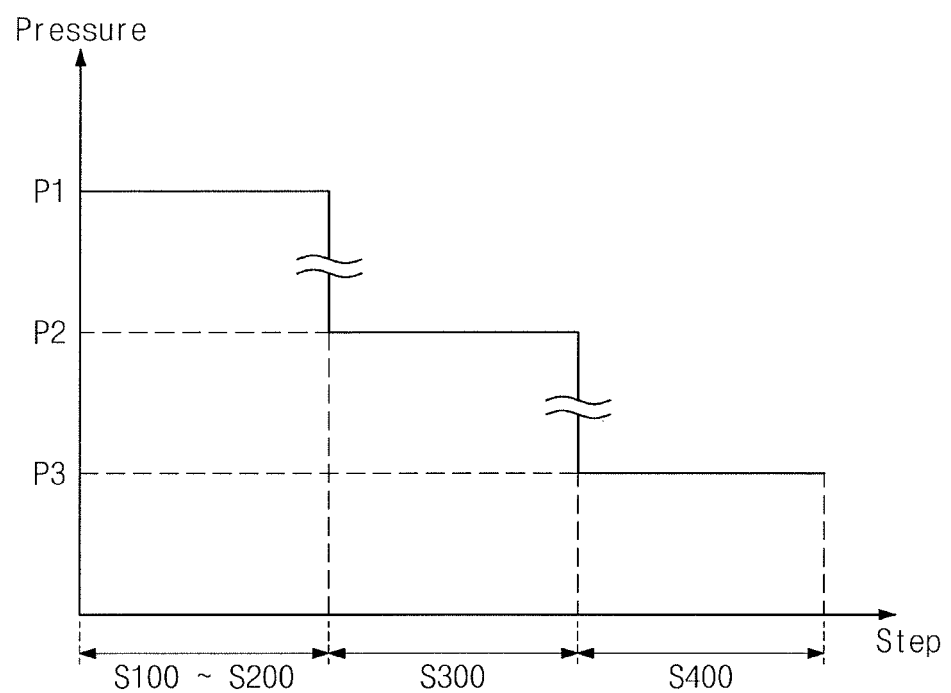
FIG. 3B illustrates a graph showing pressure changes according to each stage of a method for manufacturing a display device in FIG. 3A.

FIG. 3A is a flowchart illustrating a method for manufacturing S10 a display device DD according to an embodiment. FIG. 3B is a graph showing pressure changes at each stage in the method S10 for manufacturing a display device DD illustrated in FIG. 3A.

Referring to FIG. 3A, a method for manufacturing S10 a display device DD of an embodiment may include a substrate providing stage S100, an organic solution providing stage S200, a first depressurized drying stage S300, a second depressurized drying stage S400, and a baking stage S500.

Referring to FIG. 3B, the pressure applied in the substrate providing stage S100 and the organic solution providing stage S200 may be P1. The pressure P1 may be atmospheric pressure.

Figure 4:
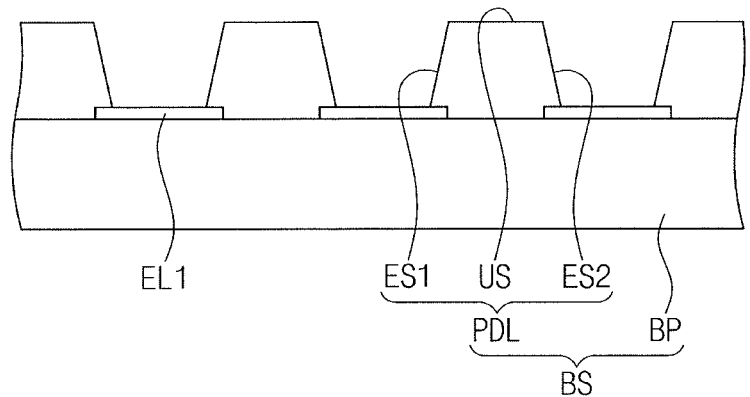
FIG. 4 illustrates a cross-sectional view of a substrate stage in FIG. 3A in which the substrate is provided.

FIG. 4 is a view illustrating the substrate at the substrate providing stage S100 in FIG. 3A. Referring to FIG. 4, the substrate providing stage S100 may include providing a substrate BS on which a plurality of pixel defining layers PDL are disposed. The first electrode EL1 may be disposed on the substrate BS.

Figure 5:
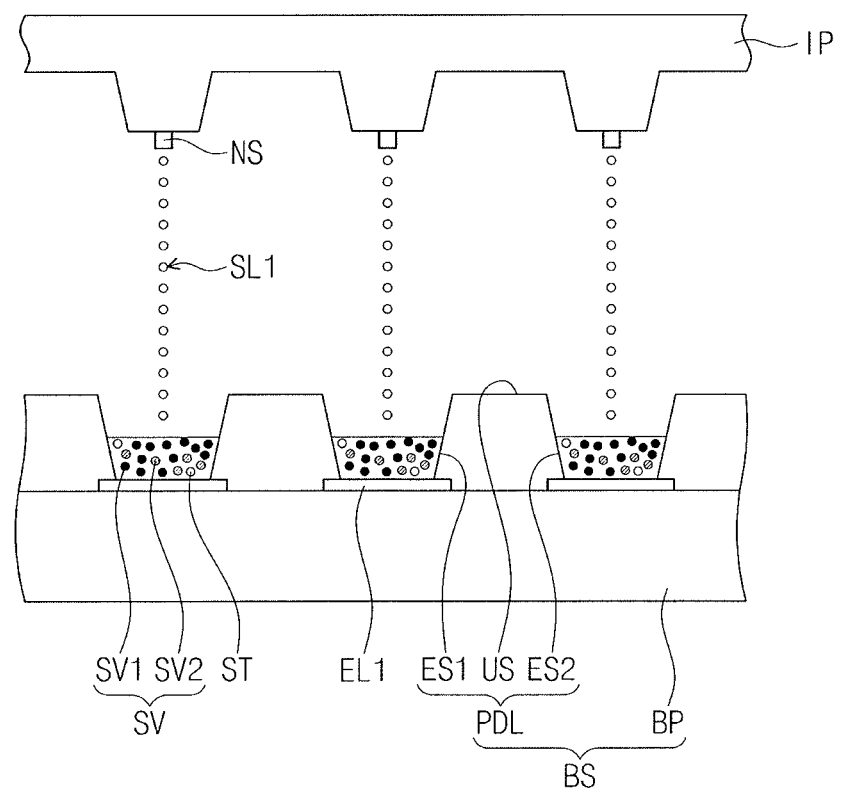
FIG. 5 illustrates a cross-sectional view of the substrate at the stage in FIG. 3A in which an organic solution is provided.

FIG. 5 is a cross-sectional view illustrating the substrate at the organic solution providing stage S200 in FIG. 3A. Referring to FIG. 5, an inkjet printing device IP may provide a first organic solution SL1 on the first electrode EL1. The first organic solution SL1 may be ejected from a nozzle portion NS of the inkjet printing device IP and provided on the first electrode EL1. For example, the first organic solution SL1 may be disposed between the pixel defining layers PD and on the first electrode EL1.

The first organic solution SL1 may include a mixed solvent SV and an organic solute ST dissolved in the mixed solvent SV. The mixed solvent SV may include a first solvent SV1 having a first boiling point and a second solvent SV2 having a second boiling point. In FIG. 5, the mixed solvent SV and the organic solute ST are simply illustrated in the first organic solution SL1, but other solvents or solutes may be further included.

A temperature at the second boiling point may be higher than a temperature at the first boiling point. The difference between the first boiling point and the second boiling point may be about 20-220° C. For example, the first boiling point may be about 160-290° C., and the second boiling point may be about 290-380° C. (exclusive of 290° C.). The boiling point may be a boiling point based on atmospheric pressure (1 atm).

An amount of the first solvent SV1 with respect to the total weight of the mixed solvent SV may be about 55-70 wt %, and an amount of the second solvent SV2 with respect to the total weight of the mixed solvent may be about 30-45 wt %. Herein, wt % indicates percentage by mass.

When the ratio of the second solvent SV2 to the total weight of the mixed solvent SV is 30 wt % or more, an unwanted reduction of the volume of the remaining second organic solution SL2 after subjected to the first depressurized drying stage S300, which will be described later, may be avoided. Accordingly, a situation wherein a first distance L1 between the substrate BS and an upper surface SL-US of the second organic solution SL2 is shorter than a second distance L2 between the substrate BS and upper surfaces US of the pixel defining layers PDL and wherein a film thickness of the organic layer OL formed by the method S10 for manufacturing a display device is non-uniform may be avoided.

When the ratio of the second solvent SV2 to the total weight of the mixed solvent SV is 45 wt % or less, blockage of the nozzle portion NS during ejecting the mixed solvent SV from the nozzle portion NS may be avoided, and viscosity may be controlled such that ejecting the mixed solvent SV may occur smoothly.

The first solvent SV1 may include at least two different solvents. For example, the first solvent SV1 may include at least two solvents having different boiling points from each other. For example, the first solvent SV1 may include a solvent having a boiling point of about 160-230° C. (exclusive of 230° C.) and a solvent having a boiling point of about 230-290° C. The boiling point of the first solvent SV1 may be defined as an average of the boiling points of the at least two different solvents. For example, the first solvent SV1 may include at least one of isobutylbenzoate, cyclohexylbenzene, 3-phenoxytoluene, triethyleneglycol dimethylether or diphenylether. For example, the first solvent SV1 may include triethyleneglycol dimethylether and diphenylether. Other suitable solvents may be included.

In some implementations, the second solvent SV2 may be made up of a single solvent. In some implementations, the second solvent SV2 may include at least one of diisopropylnaphthalene, ethylhexylsalicylate, diisobutylphthalate or benzylbenzoate. For example, the second solvent SV2 may be benzylbenzoate. The second solvent SV2 may include other solvents known in the art.

In an embodiment, a content of the organic solute ST with respect to the total weight of the first organic solution SL1 may be about 2-5 wt %. When the content of the organic solute ST is 2 wt % or more, the organic solute ST may be sufficient for forming the organic layers OL. When the content of the organic solute ST is 5 wt % or less, the organic solute ST may be sufficiently dissolved in the mixed solvent SV.

The organic solute ST may include each of the known organic layer OL materials as described above. For example, the organic solute ST may include known hole injection layer HIL materials or known hole transport layer HTL materials as described above. The organic solute ST may include one or two or more among the known organic layer OL materials.

In some implementations, the organic solute may be suitably adjusted according to the thickness of the organic layer OL to be prepared or according to the solubility in the mixed solvent SV.

The first organic solution SL1 may be ejected between the pixel defining layers PDL. When the first organic solution SL1 is ejected between the pixel defining layers PDL, there is a possibility that the first organic solution SL1 could contact a portion of the upper surfaces US of the pixel defining layers PDL. However, even if the first organic solution SL1 were to be ejected to contact with the portion of the upper surfaces US of the pixel defining layers PDL, a phenomenon that the first organic solution SL1 flows along the pixel defining layers PDL may be prevented due to the surface tension of the first organic solution SL1. In addition, an ejection amount may be adjusted so that the first organic solution SL1 is not mixed with the first organic solution SL1 ejected between the adjacent pixel defining layers PDL.

Figure 6A:
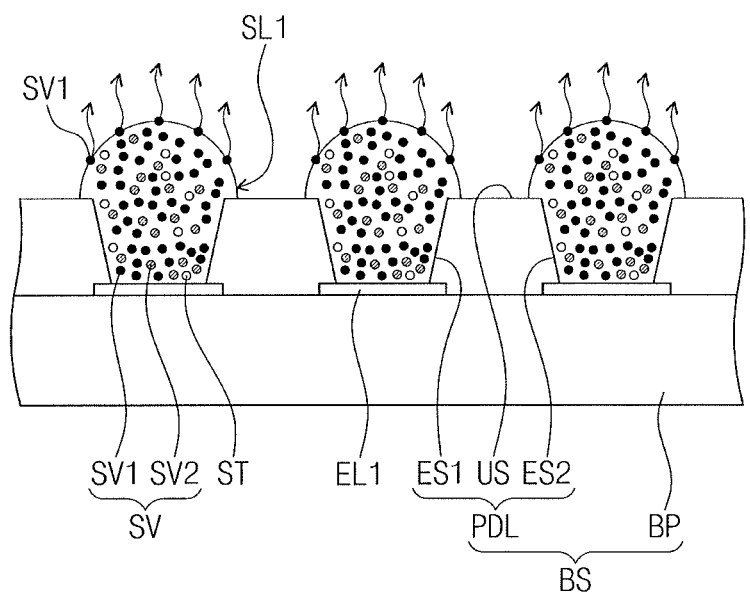
FIGS. 6A and 6B illustrate cross-sectional views depicting the substrate at a first depressurized drying stage in FIG. 3A.
Figure 6B:
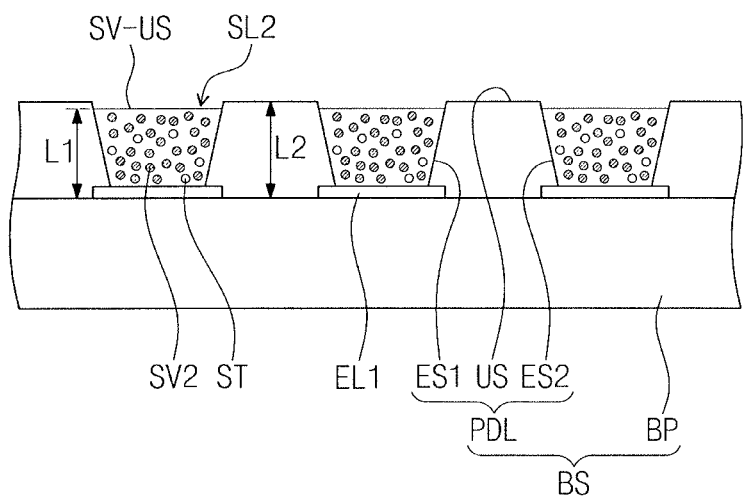

FIGS. 6A and 6B are views illustrating the first depressurized drying stage S300 in FIG. 3A. Referring to FIGS. 6A, 6B and 3B, the first depressurized drying stage S300 may be performed under a pressure P2. The first depressurized drying stage S300 may include forming the second organic solution SL2 by selectively evaporating the first solvent SV1. Herein, 'selectively evaporating' indicates that most of the selected specific components are evaporated while the remaining components hardly evaporate or substantially do not evaporate at all.

Referring to FIG. 6A, the first solvent SV1 may be selectively evaporated under the pressure P2 because the boiling point thereof is lower than the boiling points of the second solvent SV2 and the organic solute ST. For example, most of the compounds evaporated in the first depressurized drying stage S300 may be the first solvent SV1 while the second solvent SV2 and the organic solute ST may hardly evaporate or not substantially evaporate at all.

Referring to FIG. 6B, the second organic solution SL2 may include the second solvent SV2 and the organic solute ST after the first solvent SV1 has been evaporated. The second organic solution SL2 may include a small amount of the first solvent SV1 that has not been evaporated.

The first distance L1 between the substrate BS and the upper surface SL-US of the second organic solution SL2 may be about 0.8-1.2 times the second distance L2 between the substrate BS and the upper surface US of the pixel defining layers PDL. For example, the first distance L1 may be substantially the same as the second distance L2 between the substrate BS and the upper surface US of the pixel defining layers PDL. For example, the upper surface SL-US of the second organic solution SL2 may be located substantially on the same plane as the upper surface US of the pixel defining layers PDL. Herein, the term 'substantially the same' may be used to include any error that may occur in the process.

The "first distance L1 between the substrate BS and the upper surface SL-US of the second organic solution SL2" may refer an average distance between the upper surface of the substrate BS and the upper surface SL-US of the second organic solution SL2. The "second distance L2 between the substrate BS and the upper surface US of the pixel defining layers PDL" may refer to an average distance between the upper surface of the substrate BS and the upper surface US of the pixel defining layers PDL.

In the first depressurized drying stage S300, the first organic solvent SL1 has a large proportion of the first solvent SV1 having a low boiling point. Accordingly, the viscosity may be low and the fluidity may be high. Accordingly, when the first solvent SV1 shakes or internal flow occurs during the drying process, the organic solute ST may frequently contact the first side surface ES1 and the second side surface ES2 of the pixel defining layer PDL. If the first distance L1 were to be shorter than 0.8 times the second distance L2, the organic solute ST could be be attached to the first side surface ES1 and the second side surface ES2 of the pixel defining layer PDL during the drying process. In this case, if the organic solute ST is attached continuously according to the organic solute ST that has been attached to the first side surface ES1 and the second side surface ES2 of the pixel defining layer PDL during the second depressurized drying stage S400 (FIGS. 7A and 7B), the film thickness of the preliminary organic layer STL more adjacent to the first side surface ES1 and the second side surface ES2 of the pixel defining layer PDL may be formed thicker. Therefore, it could be difficult to prepare the organic layer OL having the uniform thickness.

When the first distance L1 is longer than 1.2 times the second distance L2, the upper surface of the produced second organic solution SL2 may have a upwardly convex form. In this case, when the evaporation is performed with the convex form during the second depressurized drying stage S400 (FIGS. 7A and 7B), a central portion of the preliminary organic layer STL (FIG. 7B) could be be thickly formed. Therefore, it could be difficult to prepare the organic layer OL having a uniform thickness.

In the first depressurized drying stage S300 according to an embodiment, the drying process is performed by adjusting the pressure, time, and temperature conditions. Accordingly, the first distance L1 may be formed to be in a range of about 0.8-1.2 times the second distance L2, and thus the above-described irregularities may be avoided.

The pressure P2 may be about 0.01-1 torr. When the pressure P2 is 0.01-1 torr, the phenomenon that the organic solute ST is attached to the first side surface ES1 and the second side surface ES2 of the pixel defining layer PDL may be minimized or prevented while selective evaporation of the second solvent SV2 may occur effectively.

When the pressure P2 is 0.01 torr or more, the evaporation amount of the second solvent SV2 may be controlled, and thus selective evaporation of the first solvent SV1 may be obtained. In addition, when the evaporation rate of the first solvent SV1 is controlled to be 0.01 torr or greater, the first depressurized drying stage S300 may be easily adjusted so that the first distance L1 and the second distance L2 are substantially the same.

When the P2 is 1 torr or less, a suitable evaporation rate may be obtained, and thus a suitable process rate may be obtained.

In an embodiment, the drying temperature in the first depressurized drying stage S300 may be about 10-23° C. When the drying temperature is 10° C. or more, a suitable drying rate is provided to result in a suitable process rate. When the drying temperature is 23° C. or less, an excessively high drying rate may be avoided, and it may thus be possible to adjust the first depressurized drying stage S300 so that the first distance L1 and the second distance L2 are substantially the same.

The drying time may be selected depending on the pressure condition and the temperature condition. For example, the drying time in the first depressurized drying stage S300 may be about 5-10 minutes. When the first organic solution SL1 is dried for 5-10 minutes under the above-described temperature and pressure conditions, the dried amount of the first solvent SV1 may be appropriately adjusted.

The proportion of the first solvent SV1 in the second organic solution SL2 formed after the first depressurized drying stage S300 may be lower than the proportion of the first solvent SV1 in the first organic solution SL1. For example, the ratio of the first solvent SV1 to the total weight of the second organic solution SL2 may be about 10 wt % or less, or 5 wt % or less.

Figure 7A:
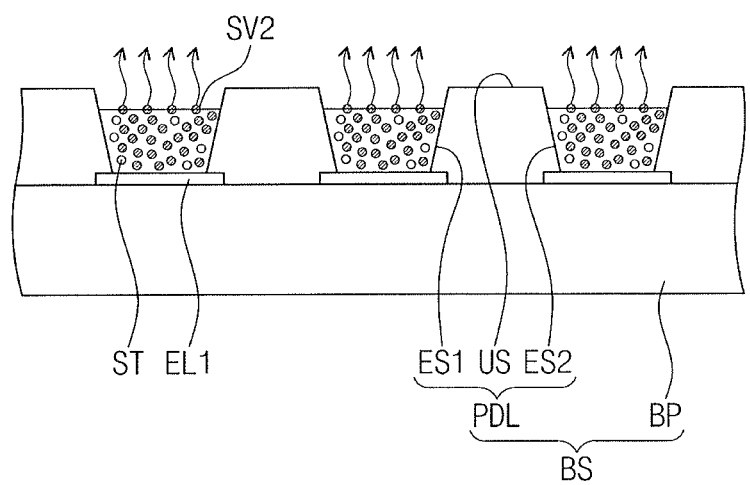
FIGS. 7A and 7B illustrate cross-sectional views depicting the substrate at a second depressurized drying stage in FIG. 3A.
Figure 7B:
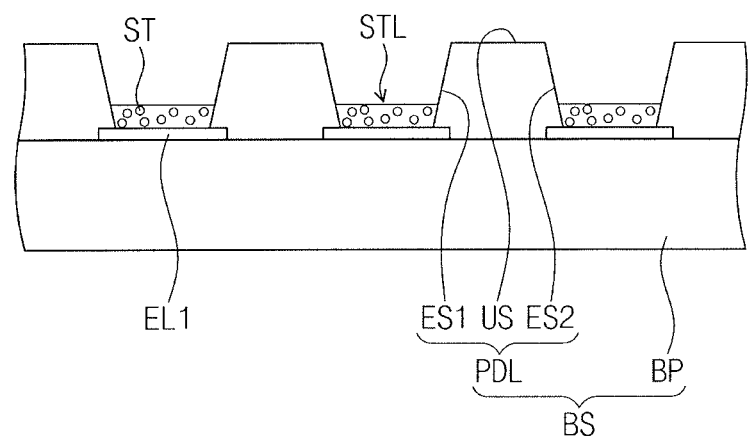

FIGS. 7A and 7B are cross-section views of the substrate illustrating the second depressurized drying stage S400 in FIG. 3A. Referring to FIGS. 7A, 7B and 3B, the second depressurized drying stage S400 may be performed under the pressure P2. The second depressurized drying stage S400 may form the preliminary organic layer STL by selectively evaporating the second solvent SV2 from the second organic solution SL2. Although FIGS. 7A and 7B illustrate that the preliminary organic layer STL includes only the organic solute ST, the preliminary organic layer STL may include a small amount of the first solvent SV1 or the second solvent SV2 that has not yet evaporated. When a portion of the first solvent SV1 remains in the second organic solution SL2, the portion may be evaporated in the second depressurized drying stage S400.

The second organic solution SL2 may have a high viscosity and a low fluidity since the first solvent SV1 having a low boiling point has been evaporated in forming the second organic solution SL2 and the second solvent SV2 having a high boiling point remains. Accordingly, the second organic solution SL2 may be prevented from shaking and the occurrence of the internal flow may be reduced during the drying process. Thus, the organic solute ST is less likely to frequently contact the first side surface ES1 and the second side surface ES2 of the pixel defining layer PDL, and the phenomenon that the organic solute ST becomes attached to the first side surface ES1 and the second side surface ES2 of the pixel defining layer PDL may be prevented. Therefore, the preliminary organic layer STL having a uniform film thickness may be formed.

The pressure P3 may be about 0.0001-0.001 torr. When the pressure P3 is 0.0001-0.001 torr, the phenomenon that the organic solute ST becomes attached to the both sides of the pixel defining layer PDL may be prevented while selective evaporation of the second solvent SV2 may occur effectively.

When the pressure P3 is 0.0001 torr or more, evaporation of the organic solute ST may be reduced or prevented, and thus the second solvent SV2 may be selectively evaporated.

When the P3 is 0.001 torr or less, the evaporation rate of the second organic solution SL2 having a high boiling point may be maintained, and a suitable process rate may be obtained.

In an embodiment, the drying temperature in the second depressurization drying stage S400 may be, for example, a room temperature, or may be the same temperature conditions as the first depressurized drying stage S400.

The drying time may be selected depending on the pressure condition and the temperature condition. In an embodiment, the drying time of the second depressurized pressure drying stage S400 may be, for example, about 5-10 minutes. When the first organic solution SL1 is dried for 5-10 minutes under the above-described temperature and pressure conditions, the dried amount of the first solvent SV1 may be appropriately adjusted.

The proportion of the second solvent SV2 in the preliminary organic layer STL formed after the second depressurized drying stage S400 may be lower than the proportion of the second solvent SV2 in the second organic solution SL2. For example, the ratio of the second solvent SV2 to the total weight of the preliminary organic layer STL may be about 10 wt % or less. Or, for example, 5 wt % or less.

Figure 8A:
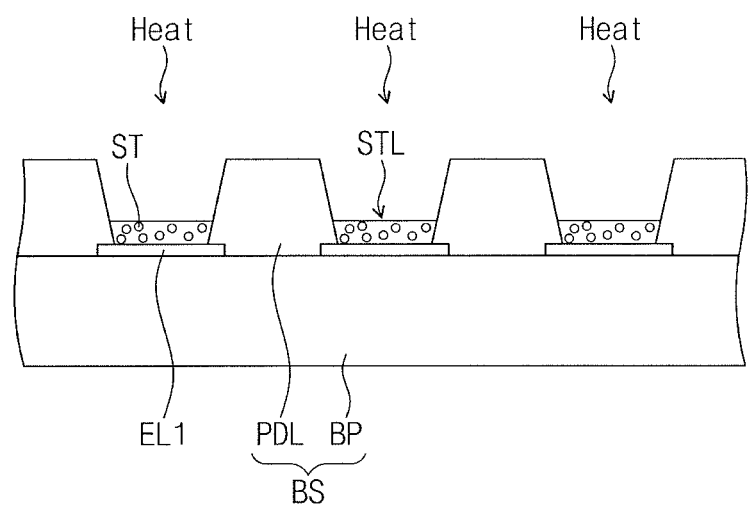
FIGS. 8A and 8B illustrate cross-sectional views of the substrate at a baking stage in FIG. 3A.
Figure 8B:
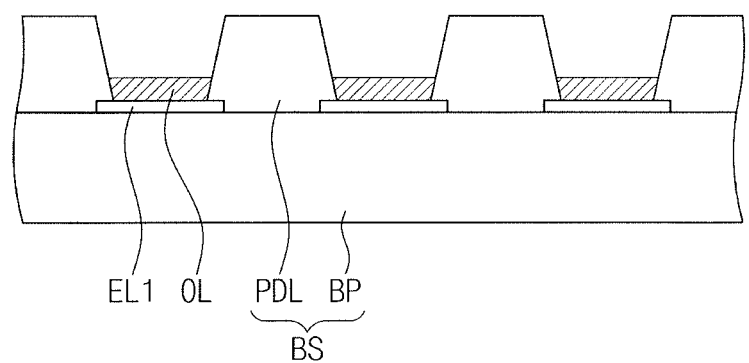

FIGS. 8A and 8B are cross-sectional views of the substrate illustrating the baking stage S500 in FIG. 3A. Referring to FIGS. 8A and 8B, the organic layer OL may be formed by supplying heat to the preliminary organic layer STL.

When heat is supplied to the preliminary organic layer STL in the baking stage S500, small amounts of the solvents SV1 and SV2 remaining in the preliminary organic layer STL may be evaporated to form the organic layer OL. The organic layer OL may be at least one of the plurality of organic layers OEL. For example, the organic layer OL may be a hole injection layer HIL.

The first organic solution SL1 may include suitable organic solutes ST according to the kinds of the plurality of organic layers OEL to be formed. For example, the organic solutes ST may include the materials for the above-described plurality of organic layers OEL.

The plurality of organic layers OEL may be formed by repeatedly depositing the organic layer OL according to the method S10 for manufacturing a display device in accordance with an embodiment.

Hereinafter, as an aid to understanding, embodiments will be described in more detail with reference to FIGS. 9A, 9B, 10A and 10B, and Examples and Comparative Examples to aid understanding.

Figure 9A:
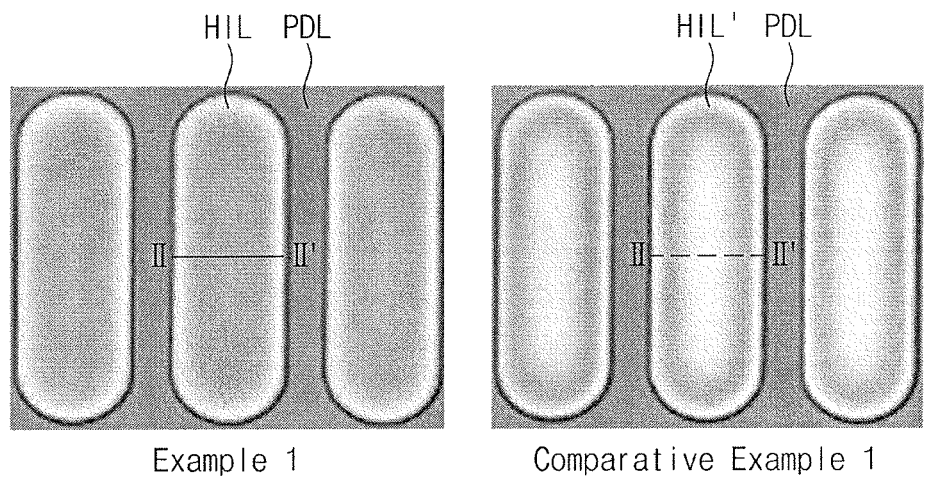
FIG. 9A illustrates an enlarged plan view of a hole injection layer prepared according to Example 1 and a hole injection layer prepared according to Comparative Example 1.

FIG. 9A is an enlarged image, obtained using a confocal microscope, of a hole injection layer HIL prepared according to Example 1 and a hole injection layer HIL' prepared according to Comparative Example 1.

Figure 9B:
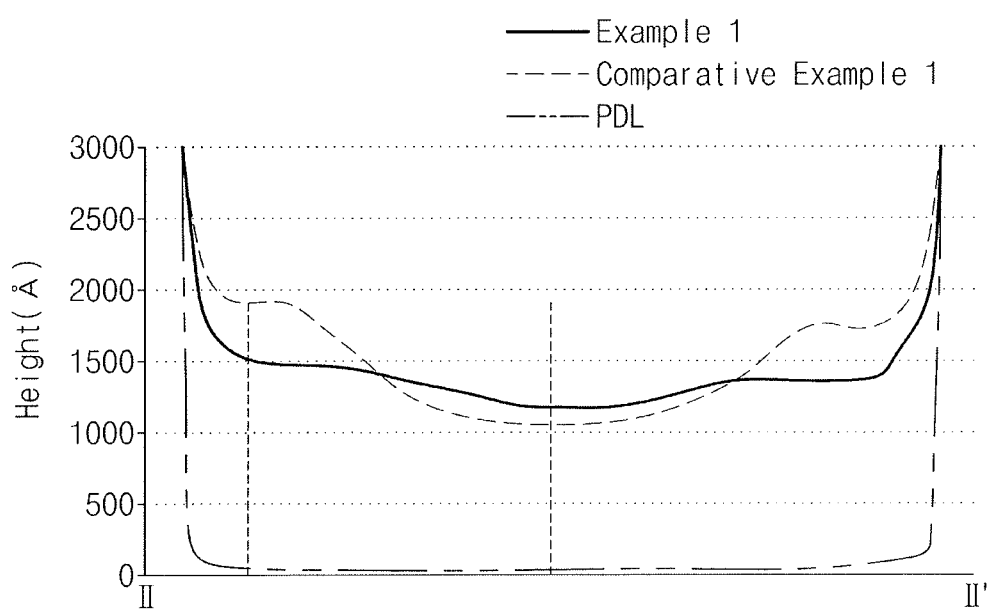
FIG. 9B illustrates a graph showing the thicknesses of cross sections of hole injection layers taken along II-II' in FIG. 9A.

FIG. 9B is a graph showing the thicknesses of cross sections of hole injection layers HIL and HIL' taken along II-II' in FIG. 9A.

Figure 10A:
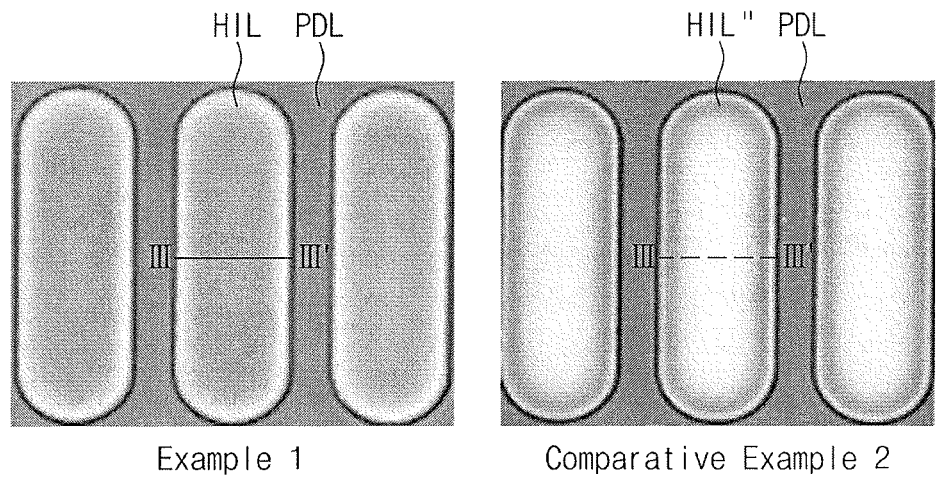
FIG. 10A illustrates an enlarged plan view of a hole injection layer prepared according to Example 1 and a hole injection layer prepared according to Comparative Example 2.

FIG. 10A is an enlarged image, obtained using a confocal microscope, of a hole injection layer HIL prepared according to Example 1 and a hole injection layer HIL'' prepared according to Comparative Example 2.

Figure 10B:
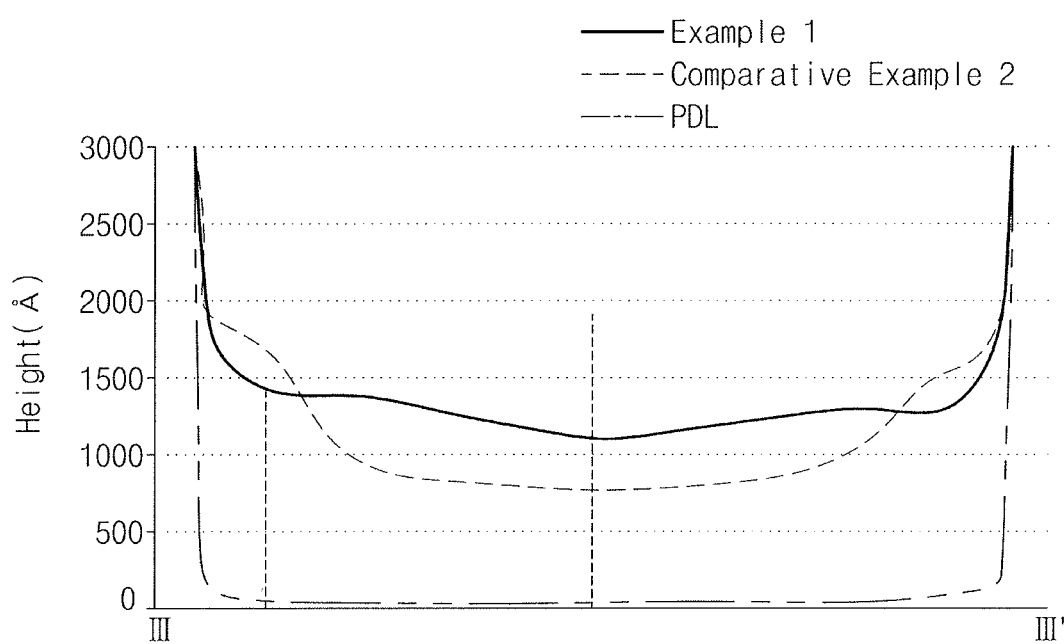
FIG. 10B illustrates a graph showing the thicknesses of cross sections of hole injection layers taken along III-III' in FIG. 10A.

FIG. 10B is a graph showing the thicknesses of cross sections of hole injection layers HIL and HIL' taken along III-III' in FIG. 10A.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples and Comparative Examples

Table 1 shows compositions of an organic solution A and an organic solution B used in Examples and Comparative Examples.

TABLE 1

|  | Triethyleneglycol dimethylether | Diphenyl ether | Benzylbenzoate | Organic solute |
|---|---|---|---|---|
| Organic solution A | 12.8 wt % | 40.4 wt % | 44 wt % | 2.8 wt % |
| Organic solution B | 24 wt % | 73.2 wt % | — | 2.8 wt % |

Triethyleneglycol dimethylether having a boiling point of 216° C., diphenylether having a boiling point of 258° C., and benzylbenzoate having a boiling point 324° C., were used in the organic solution A and organic solution B in the relative amounts shown in Table 1. For an organic solute ST, a hole injection material was used.

In Example 1, triethyleneglycol dimethylether and diphenylether were used as a first solvent SV1 having a first boiling point, and benzylbenzoate was used as a second solvent SV2 having a second boiling point to form an organic solution A. Thereafter, a drying process was performed for 5 minutes in a first depressurized drying stage S300 under a pressure of 0.01 torr, and then a drying process was performed for 10 minutes in a second depressurized drying stage S400 under a pressure of 0.0001 torr to form a hole injection layer HIL.

In Comparative Example 1, triethyleneglycol dimethylether and diphenylether were used as a first solvent SV1 having a first boiling point, and benzylbenzoate was used as a second solvent SV2 having a second boiling point to form an organic solution A. Thereafter, a drying process was performed for 15 minutes as a one-step drying process under a pressure of 0.0001 torr to form a hole injection layer HIL'.

In Comparative Example 2, triethyleneglycol dimethylether and diphenylether were used as a first solvent SV1 having a first boiling point to form an organic solution A. Thereafter, a drying process was performed for 5 minutes in a first depressurized drying stage S300 under a pressure of 0.01 torr, and then a drying process was performed for 10 minutes in a second depressurized drying stage S400 under a pressure of 0.0001 torr to form a hole injection layer HIL".

In Comparative Example 3, triethyleneglycol dimethylether and diphenylether were used as a first solvent SV1 having a first boiling point to form an organic solution B. Thereafter, a drying process was performed for 15 minutes as a one-step drying process under a pressure of 0.0001 torr to form a hole injection layer.

Table 2 shows thickness uniformity of the hole injection layer HIL formed according to Example 1 and Comparative Examples.

TABLE 2

| | Thickness of edge periphery portion (Å) | Thickness of central portion (Å) | Thickness difference (Å) |
|---|---|---|---|
| Example 1 | 1349 | 1107 | 242 |
| Comparative Example 1 | 1797 | 989 | 808 |
| Comparative Example 2 | 1911 | 824 | 1087 |
| Comparative Example 3 | 1809 | 745 | 1064 |

In Example 1, the organic solution obtained by mixing two of the first solvent SV1 having a low boiling point and one of the second solvent SV2 having a high boiling point was used. The two-stage drying process, which included the first depressurized drying stage S300 proceeding under a pressure of 0.01 torr and the second depressurized drying stage S400 proceeding under a pressure of 0.0001 torr, was performed, and as a result, the thickness difference between the edge periphery portion and the central portion of the hole injection layer HIL was significantly smaller than that of Comparative Examples. In Comparative Example 1, the organic solution obtained by mixing two of the first solvent SV1 having a low boiling point and one of the second solvent SV2 having a high boiling point was used. However, since only the one-stage drying process was performed, the thickness difference between the edge periphery portion and the central portion of the hole injection layer HIL' was relatively large. In Comparative Example 2, the two-stage drying process, which included the first depressurized drying stage S300 proceeding under a pressure of 0.01 torr and the second depressurized drying stage S400 proceeding under a pressure of 0.0001 torr, was performed. However, since only one of the first solvent SV1 having a low boiling point was used, the fluidity of the organic solution was high, and the thickness difference between the edge periphery portion and the central portion of the hole injection layer HIL" was relatively large. In Comparative Example 3, only one of the first solvent SV1 having a low boiling point was used and only a one-step drying process was performed. As a result the thickness difference between the edge periphery portion and the central portion of the hole injection layer was relatively large.

Referring to FIGS. 9A and 10A, the hole injection layers HIL, HIL' and HIL" disposed between the pixel defining layers PDL are illustrated. In Comparative Example 1 and Comparative Example 2, the thicknesses of the hole injection layers HIL' and HIL" were non-uniform compared to Example 1, and thus ring-shaped bands were observed along the outer periphery portions of the hole injection layers HIL' and HIL".

Referring to FIGS. 9B and 10B, the thickness of the hole injection layer HIL in the entire portions was uniformly formed in Example 1, while the thicknesses of the hole injection layers HIL' and HIL" were sharply increased from the central portion to the outer periphery portion.

Figure 11A:
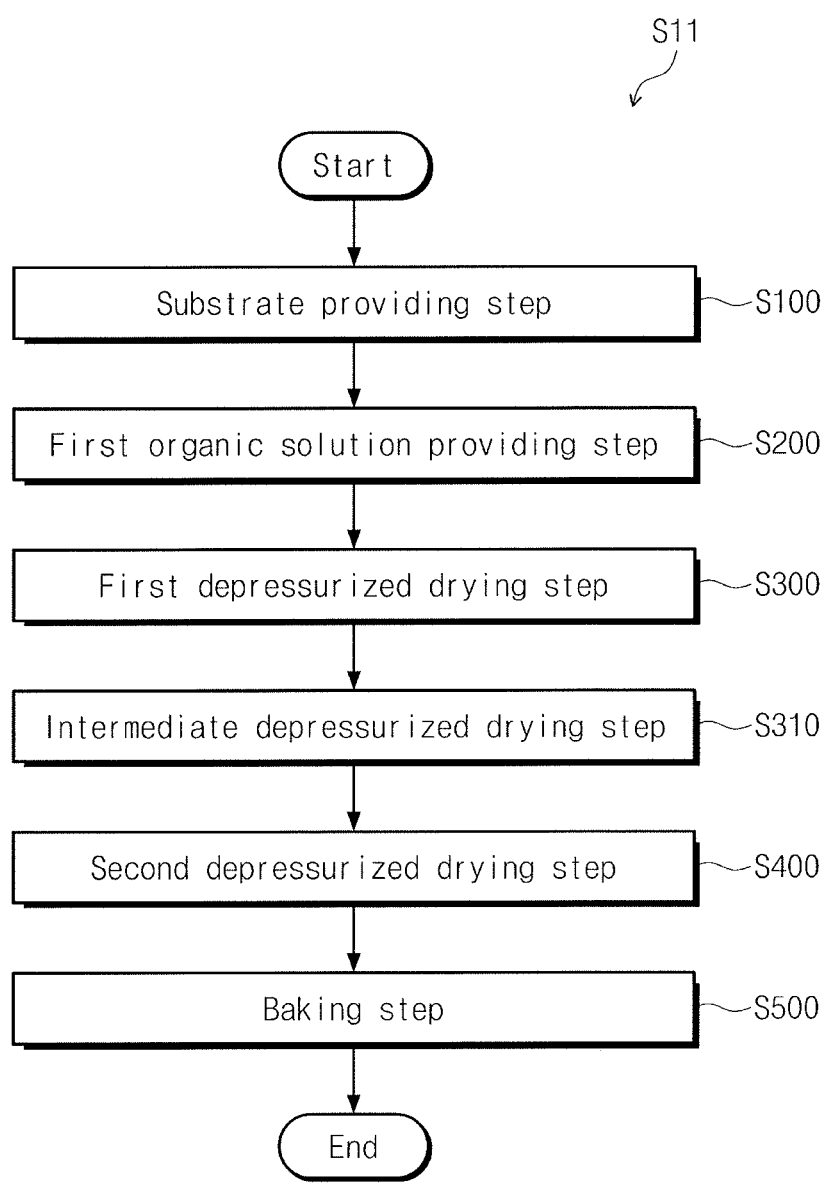
FIG. 11A illustrates a flowchart of a method for manufacturing a display device according to an embodiment.
Figure 11B:
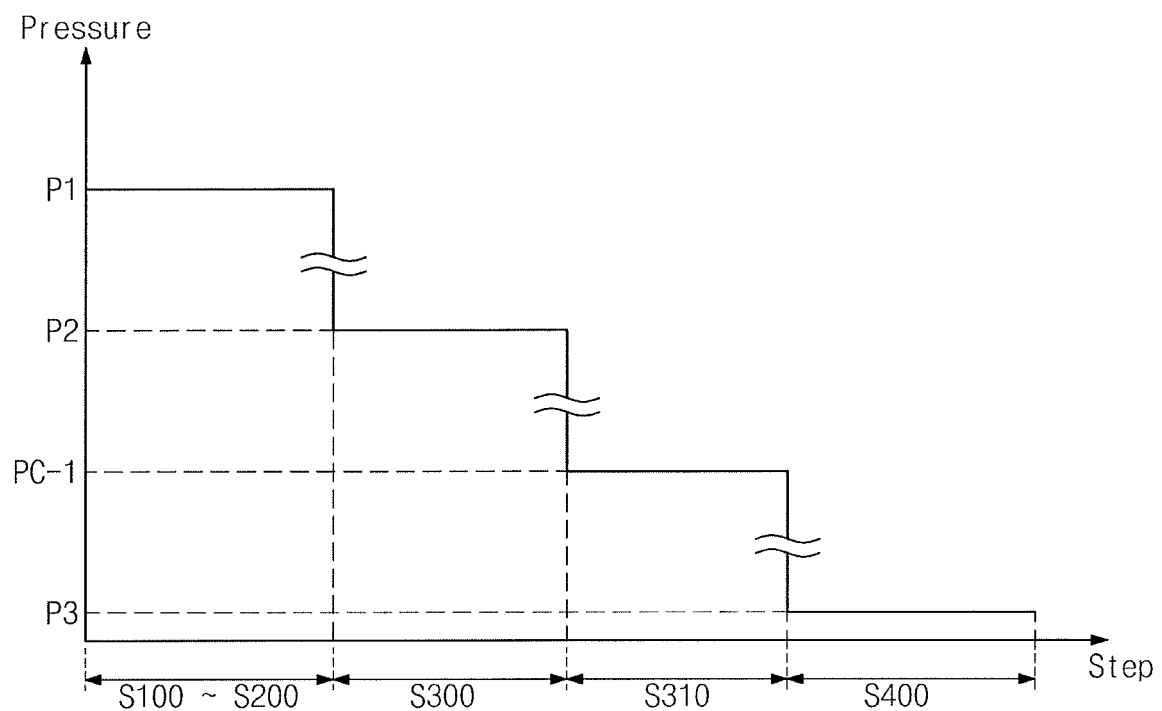
FIG. 11B illustrates a graph showing pressure changes according to each stage in the method for manufacturing a display device in FIG. 11A.

FIG. 11A is a flowchart illustrating a method S11 for manufacturing a display device DD according to an embodiment. FIG. 11B is a graph showing the pressure changes in each stage in the method S11 for manufacturing a display device DD illustrated in FIG. 11A.

Referring to FIG. 11A, the method S11 for manufacturing a display device DD according to an embodiment may further include an intermediate depressurized drying stage S310 between the first depressurized drying stage S300 and the second depressurized drying stage S400.

Figure 12:
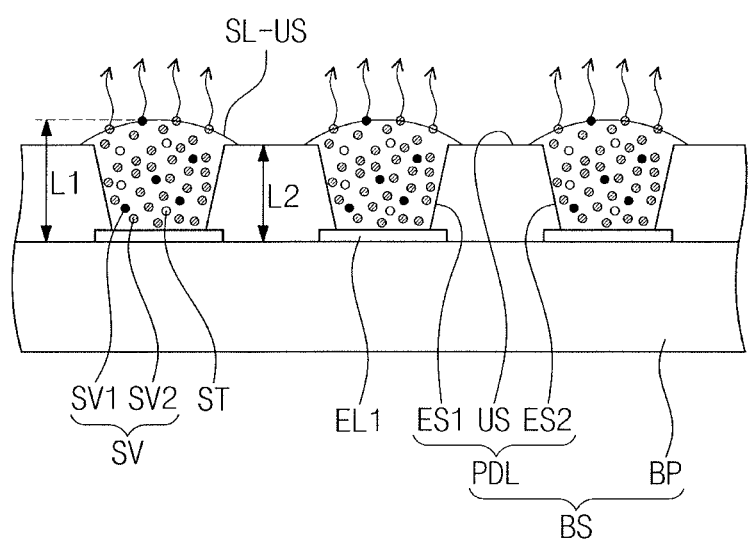
FIG. 12 illustrates a cross-sectional view of the substrate at an intermediate depressurized drying stage in FIG. 11A.

Referring to FIGS. 12 and 11B, the intermediate depressurized drying stage S310 may performed under a pressure PC1. The pressure PC1 may be about 0.001-0.01 torr.

The intermediate depressurized drying stage S310 may be a stage for further drying the second organic solution SL2. In the intermediate depressurized drying stage S310, the second solvent SV2 may be evaporated, and the remaining small amount of the first solvent SV1 may also be evaporated.

When the proportion of the second solvent SV2 in the first organic solution SL1 is large, the drying process may not be sufficiently performed under the time, temperature and pressure conditions in the first depressurized drying stage S300. In this case, since the first distance L1 may be longer than the second distance L2. A further drying process may be performed so that the first distance L1 and the second distance L2 are substantially equal to each other. The drying process may be performed for about 1 minute to 2 minutes under the pressure PC1. When the second organic solution SL2 is further dried in the intermediate depressurized drying stage S310, the first distance L1 of the second organic solution SL2 may be adjusted to be substantially the same as the second distance L2. When the pressure in the intermediate depressurized drying stage S310 is higher than the pressure in the second depressurized drying stage S400, the evaporation rate may be relatively slow, and thus the evaporation amount may be easily adjusted. In this case, the drying process may be performed at a suitable temperature, for example, under the same temperature as the first depressurized drying stage S300.

Figure 13A:
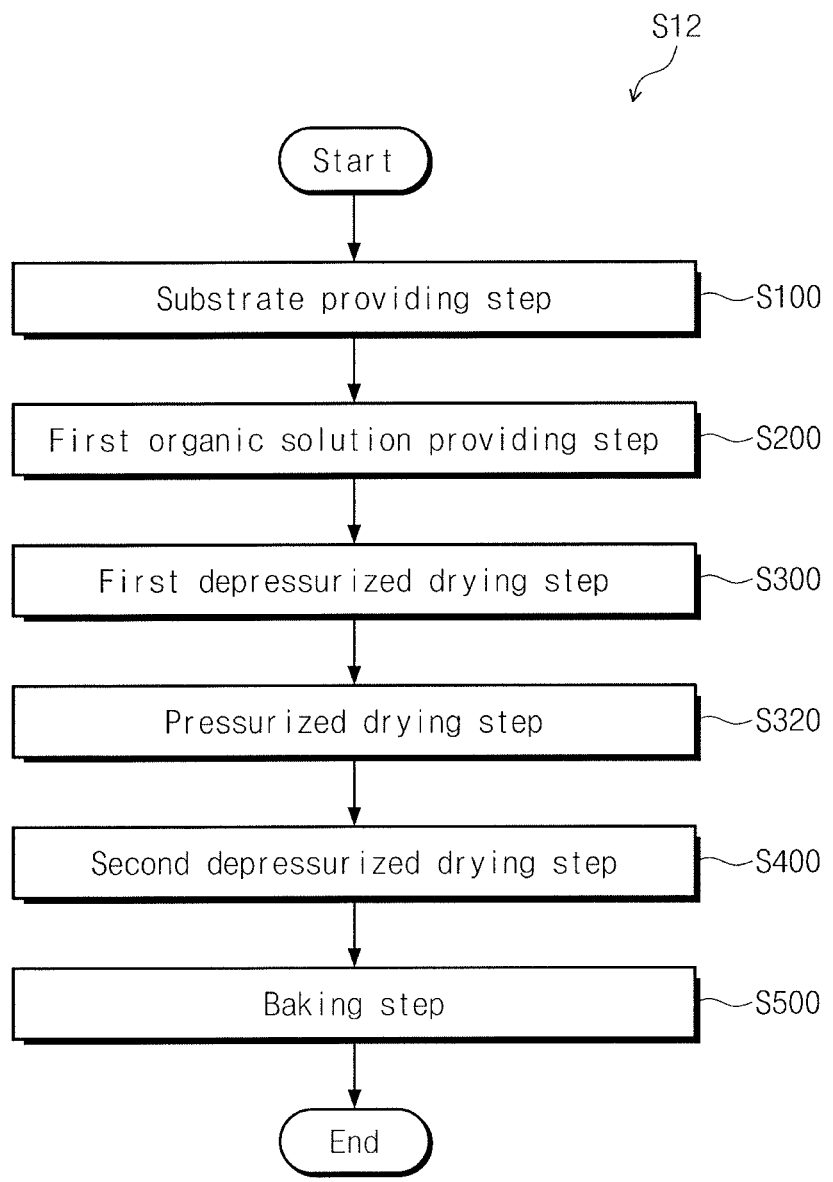
FIG. 13A illustrates a flowchart of a method for manufacturing a display device according to an embodiment.
Figure 13B:
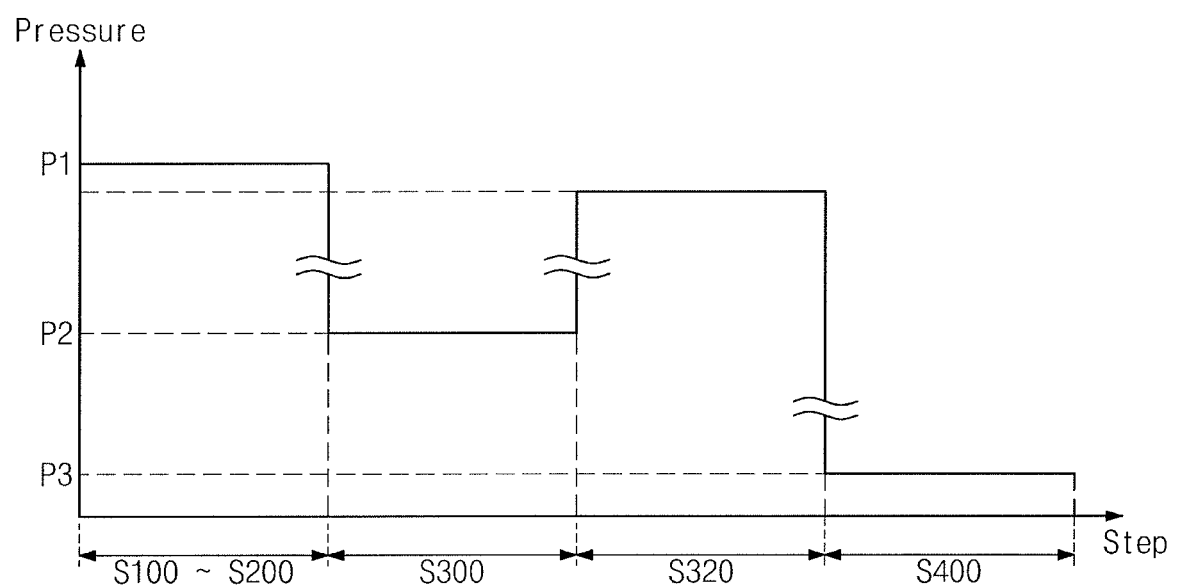
FIG. 13B illustrates a graph showing pressure changes at each stage in the method for manufacturing a display device in FIG. 13A.

FIG. 13A is a flowchart illustrating the method S12 for manufacturing a display device DD according to an embodiment. FIG. 13B is a graph showing the pressure changes at each stage in the method S12 for manufacturing a display device DD illustrated in FIG. 11A.

Referring to FIG. 13A, the method S12 for manufacturing a display device DD according to an embodiment may further include a pressurized drying stage S320 between the first depressurized drying stage S300 and the second depressurized drying stage S400.

Figure 14:
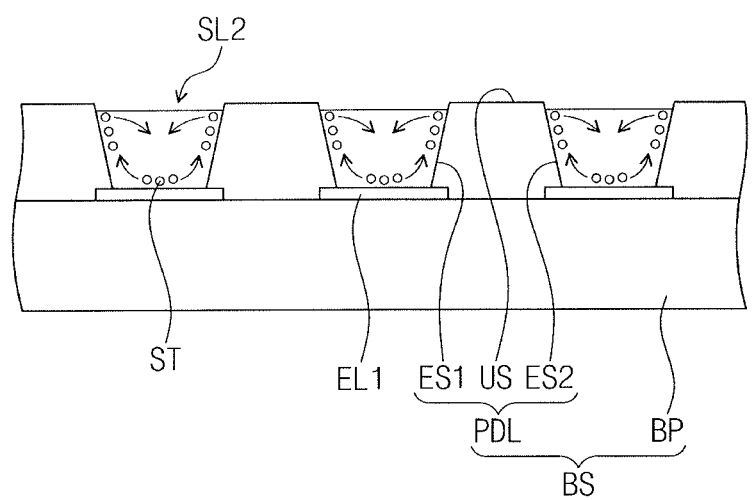
FIG. 14 illustrates a cross-sectional view of the substrate at the pressurized drying stage in FIG. 13A.

Referring to FIGS. 14A and 13B, the pressurized drying stage S320 may be performed under a pressure PC2. In FIG. 13B, the pressure PC2 is shown as lower than the pressure P1. In some implementations, the pressure PC2 may be higher than the pressure P1. For example, the pressure PC2 may be about 750-1000 torr.

FIG. 14A illustrates a cross-sectional view of the substrate showing only the organic solute ST of the compositions of the second organic solution SL2. Referring to FIG. 14A, when the first organic solution SL1 has high fluidity, an internal flow inside the organic solution may occur during the formation of the second organic solution SL2 in the first depressurized drying stage S300. The second organic solution SL2 thus prepared may have a higher viscosity than that of the first organic solution SL1, but the flow may still occur inside the second organic solution SL2 due to the inertia. In this case, if the second depressurized drying stage S400 were to be performed immediately without the pressurized drying stage S320, the organic solute ST in the process could become attached to the first side surface ES1 and the second side surface ES2. Thus, the thickness of the preliminary organic layer STL could be formed non-uniformly.

In the pressurized drying stage S320, the drying process is performed under the high pressure. Accordingly, a small amount of the second organic solution SL2 may be evaporated. For example, the drying process may be substantially stopped. The pressurized drying stage S320 may be performed during the process, thereby stopping the drying process, so that the internal flow of the organic solution may be stopped. Then, when the second depressurized drying stage S400 is performed after stopping the internal flow of the second organic solution SL2, the film thickness of the organic layer OL thus formed may be even more uniform.

By way of summation and review, an organic electroluminescent display device, as a so-called self-luminous display device, includes an organic element composed of, for example, a first electrode, a hole transport layer disposed on the first electrode, a light emitting layer disposed on the hole transport layer, an electron transport layer disposed on the light emitting layer, and a second electrode disposed on the electron transport layer.

To dispose a plurality of organic layers such as the hole transport layer, the light emitting layer and the electron transport layer, a vacuum evaporation method may be used, and a fine metal masking method using a fine metal mask (FMM) and an inkjet printing method using an inkjet print, etc. may be used.

When depositing the plurality of the organic layers using the inkjet printing method, there has been an issue that a film thickness of the plurality of the organic layers has been non-uniform. Recently, studies for improving uniformity of the film thickness have been actively conducted.

Embodiments provide a method for manufacturing a display device including an organic layer which has a uniform thickness According to an embodiment, a method for manufacturing a display device may include: providing a substrate on which a plurality of pixel defining layers are disposed; providing a first organic solution between the pixel defining layers, the first organic solution including a mixed solvent containing two or more solvents having different boiling points and an organic solute dissolved in the mixed solvent; first depressurized drying performed under a pressure of 0.01-1 torr; and second depressurized drying performed under a pressure of 0.0001-0.001 torr. A display device including an organic layer which has a uniform thickness may be manufactured according to the method for manufacturing a display device in accordance with an embodiment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a display device, the method comprising:
providing a substrate on which a plurality of pixel defining layers are disposed;
providing a first organic solution between the pixel defining layers, the first organic solution including a mixed solvent containing a first solvent having a first boiling point and a second solvent having a second boiling point, and an organic solute dissolved in the mixed solvent;
conducting a first depressurized drying to form a second organic solution by applying a pressure of 0.01-1 torr to the first organic solution; and
conducting a second depressurized drying to form a preliminary organic layer by applying a pressure of 0.0001-0.001 torr to the second organic solution.

2. The method as claimed in claim 1, wherein a difference between the first boiling point and the second boiling point is 20-220° C.

3. The method as claimed in claim 2, wherein:
the first boiling point is in a range of 160-290° C., and
the second boiling point is in a range of 290-380° C., exclusive of 290° C.

4. The method as claimed in claim 1, wherein a first distance between the substrate and an upper surface of the second organic solution is 0.8-1.2 times a second distance between the substrate and an upper surface of the pixel defining layers.

5. The method as claimed in claim 1, wherein the first depressurized drying is performed at 10-23° C.

6. The method as claimed in claim 1, wherein a ratio of the first solvent in the second organic solution with respect to the entirety of the second organic solution is smaller than a ratio of the first solvent in the first organic solution with respect to the entirety of the first organic solution.

7. The method as claimed in claim 1, wherein a ratio of a weight of the second solvent in the preliminary organic layer with respect to a total weight of the preliminary organic layer is smaller than a ratio of a weight of the second solvent in the second organic solution with respect to a total weight of the second organic solution.

8. The method as claimed in claim 1, further comprising an intermediate depressurized drying between the first depressurized drying and the second depressurized drying, the intermediate depressurized drying includes applying a pressure of 0.001-0.01 torr to the second organic solution.

9. The method as claimed in claim 1, further comprising a pressurized drying between the first depressurized drying and the second depressurized drying, the pressurized drying includes applying a pressure of 750-1000 torr to the second organic solution.

10. The method as claimed in claim 1, wherein, with respect to a total weight of the mixed solvent, an amount of the first solvent is 55-70 wt %, and an amount of the second solvent is 30-45 wt %.

11. The method as claimed in claim 1, wherein the first solvent includes two or more different solvents.

12. The method as claimed in claim 1, wherein the first solvent includes at least one of isobutylbenzoate, cyclohexylbenzene, 3-phenoxytoluene, triethyleneglycol dimethylether or diphenylether, and
the second solvent includes at least one of diisopropylnaphthalene, ethylhexylsalicylate, diisobutylphthalate or benzylbenzoate.

13. The method as claimed in claim 1, wherein the first solvent includes triethyleneglycol dimethylether and diphenylether, and
the second solvent is benzylbenzoate.

14. The method as claimed in claim 1, wherein a content of the organic solute with respect to a total weight of the first organic solution is 2-5 wt %.

15. The method as claimed in claim 1, further comprising baking the preliminary organic layer to form an organic layer by supplying heat to the preliminary organic layer.

16. A method for manufacturing a display device including a base substrate, a first electrode disposed on the base substrate, and a plurality of organic layers disposed on the first electrode, the method comprising:
providing a first organic solution onto the first electrode, the first organic solution including a mixed solvent containing a first solvent having a first boiling point and a second solvent having a second boiling point as higher as 20-220° C. than the first boiling point, and an organic solute dissolved in the mixed solvent;
conducting a first depressurized drying to form a second organic solution by drying the first organic solution under a pressure of 0.01-1 torr;
conducting a second depressurized drying to form a preliminary organic layer by drying the second organic solution under a pressure of 0.0001-0.001 torr; and
baking the preliminary organic layer to form at least one organic layer of the organic layers by supplying heat to the preliminary organic layer.

17. The method as claimed in claim 16, wherein: the display device further includes a plurality of pixel defining layers disposed on the base substrate, and
a first distance between the base substrate and an upper surface of the second organic solution is 0.8-1.2 times a second distance between the base substrate and an upper surface of the pixel defining layers.

18. The method as claimed in claim 16, wherein the first boiling point is 160-290° C., and the second boiling point is 290-380° C., exclusive of 290° C.

19. The method as claimed in claim 16, wherein, with respect to a total weight of the mixed solvent, an amount of the first solvent is 55-70 wt %, and an amount of the second solvent is 30-45 wt %.

20. The method as claimed in claim 16, wherein:
the organic solute includes a hole injection material, and
the at least one organic layer is a hole injection layer disposed on the first electrode.

* * * * *